(12) United States Patent
Sosin et al.

(10) Patent No.: US 9,784,778 B2
(45) Date of Patent: Oct. 10, 2017

(54) SYSTEM AND METHOD FOR ACCUMULATING AND MEASURING A SLOWLY VARYING ELECTRICAL CHARGE

(71) Applicant: UNIWERSYTET JAGIELLONSKI, Krakow (PL)

(72) Inventors: Zbigniew Sosin, Lednica Gorna (PL); Marek Adamczyk, Oswiecim (PL); Maciej Sosin, Lednica Gorna (PL); Pawel Lasko, Nowy Sacz (PL)

(73) Assignee: Uniwersytet Jagiellonski, Krakow (PL)

( * ) Notice: Subject to any disclaimer, the term of this patent is extended or adjusted under 35 U.S.C. 154(b) by 0 days.

(21) Appl. No.: 14/778,886

(22) PCT Filed: Dec. 14, 2014

(86) PCT No.: PCT/EP2014/077659
§ 371 (c)(1),
(2) Date: Sep. 21, 2015

(87) PCT Pub. No.: WO2015/086849
PCT Pub. Date: Jun. 18, 2015

(65) Prior Publication Data
US 2016/0274159 A1    Sep. 22, 2016

(30) Foreign Application Priority Data
Dec. 14, 2013   (PL) ......................................... 406497

(51) Int. Cl.
*G01R 29/24*   (2006.01)
*H03F 3/70*    (2006.01)

(52) U.S. Cl.
CPC ............... *G01R 29/24* (2013.01); *H03F 3/70* (2013.01)

(58) Field of Classification Search
CPC ............... G01R 31/3627; G01R 27/26; G01R 31/2831; G01N 27/4145; G01N 33/66
USPC ........... 324/654–661, 600, 519, 500, 750.17, 324/754.28, 548
See application file for complete search history.

(56) References Cited

U.S. PATENT DOCUMENTS 5,537,078 A * 7/1996 Strong ................ H03F 3/45076
330/253
2002/0153957 A1* 10/2002 Jordanov ................ H03F 3/082
330/308

* cited by examiner

*Primary Examiner* — Melissa Koval
*Assistant Examiner* — Trung Nguyen
(74) *Attorney, Agent, or Firm* — Mark M. Friedman

(57) ABSTRACT

A system for measuring electrical charge, comprising a capacitance detector (110) connected to a charge integrator (120) being an operational amplifier with capacitance (Cf) feedback (130), wherein the input stage (121) of the charge integrator (120) comprises a pair of symmetrically connected complementary JFET transistors ($T_1$, $T_2$), the gates of which are connected to the input of the charge integrator (120), characterized in that an n-type transistor ($T_1$) of the complementary pair of transistors ($T_1$, $T_2$) has its drain connected to a voltage regulating system (122).

6 Claims, 4 Drawing Sheets

SYSTEM AND METHOD FOR ACCUMULATING AND MEASURING A SLOWLY VARYING ELECTRICAL CHARGE

TECHNICAL FIELD

The present invention relates to a system for accumulating and measuring a slowly varying electrical charge, more particularly the charge induced by a field of a very low frequency.

BACKGROUND

There are known systems for measuring an electrical charge using a charge integrator. A typical structure of this type is shown in FIG. 1. The system comprises a capacitance detector 110 connected to a charge integrator 120, which is an operational amplifier with capacitance feedback 130. Measurement of electrical charge q in a system of this type is based on transferring a charge accumulated in a detector system to a reference feedback capacitance $C_f$ and measuring the charge of this capacitance using the equation:

$$u = \frac{q}{C_f}$$

The capacitance $C_d$ of the detector 110 is connected to the input of the charge integrator 120, which has an input impedance. This input impedance has a capacitive character and comprises mainly the dynamic capacitance of the system $C_{dyn}=(K+I)Cf$ and is slightly modified by an input geometric capacitance $C_{in}$ connected in parallel thereto. This parallel connection of the detector capacitance $C_d$ and the capacitance $C_{dyn}+C_{in}$ results in that the charge q accumulated in the detector in the section αq is transferred to the feedback capacitance $C_f$. The coefficient α is equal to:

$$\alpha = \frac{C_{wej} + (K+1)C_f}{C_d + C_{wej} + (K+1)C_f}$$

Because the amplification coefficient K of the amplifier system (without feedback) is very large (typically $K=10^3 \ldots 10^9$), then for typical capacitance values, $C_f$, $C_{in}$, $C_d$ (in the range from one to several hundred pF), the coefficient α is close to unity. For this reason, almost 100% of the charge collected by the detector is transferred to the feedback capacitance. The amount of the charge q collected by the detector depends on the size of the detector, its type (the substance used, e.g. gas or solid state-semiconductor), as well as the value of the electrical field, which accumulates the generated charge. To accumulate this charge optimally, relatively high voltage is used for powering the detection system.

The best noise parameters are achieved in systems, wherein the input electronic circuits are based on JFET transistors with the feedback resistor removed. In standard systems of this type, this causes slow charging of the feedback capacitance by a reverse current of the junction. This current cannot be compensated by using drain feedback or optoelectronic feedback. These feedback types only allow controlling of the increase of the reverse current of the junction without the possibility of changing its direction.

The only possibility of compensation is connecting an external power source, in which the direction of current flow (due to accumulation of the charge on capacitance $C_f$) occurs in the direction opposite to the direction determined by the gate current $I_G$ of the JFET transistor. Such situation can occur, when e.g. a semiconductor detector is connected to the input of the integrator. An example of such system is shown in FIG. 2. Still, each such interference into the system increases, usually many times, the input noise level. In case of connecting the semiconductor detector there appears a junction which charges the $C_f$ capacitance with $I_D$ current of direction opposite to the direction of the gate current of the transistor.

A similar method of compensating the gate current of transistor $T_1$ is achieved in the system formed of complementary field effect transistors, as shown in FIG. 3, known from the publication of the PCT application WO2012114291. In such systems, the junction which compensates the gate current of the n-channel transistor is a p-channel transistor. In such solution, the additional junction of p-channel transistor virtually does not lower the parameters of the system, and moreover, it tends to improve these parameters, especially in case of systems of high capacitance. This is due to the fact that p-channel transistor participates in a symmetrical way in the process of signal amplification. In this system, the compensation is typically not complete (due to the fact that it is virtually impossible to match junction transistors so that they could have identical gate currents). It would be desirable to provide such a modification of the system that would allow to achieve a full equalization of gate currents.

It would also be desirable to improve the system for measuring the electrical charge so that the system would be particularly useful for accumulating and precisely measuring a slowly varying electrical charge.

SUMMARY

There is presented a system for measuring electrical charge, comprising a capacitance detector connected to a charge integrator being an operational amplifier with capacitance feedback, wherein the input stage of the charge integrator comprises a pair of symmetrically connected complementary JFET transistors, the gates of which are connected to the input of the charge integrator, wherein an n-type transistor of the complementary pair of transistors has its drain connected to a voltage regulating system.

Preferably, the voltage controlling system is a manually-controlled potentiometer.

Preferably, the voltage controlling system is a system adapted to automatically set the drain voltage of the n-type transistor to a value for which the constant component of the output voltage does not change.

Preferably, for a quiescent voltage, the gate current of the n-type transistor is lower than the gate current of the p-type transistor.

Preferably, the drain of the n-type transistor is powered by the power source whose current is independent of the voltage potential of the drain of the n-type transistor.

Preferably, the system further comprises a regulated power source connected to the drain of the p-type transistor.

There is also presented a method for measuring an electrical charge by means of a system comprising a capacitance detector connected to a charge integrator being an operational amplifier with capacitance feedback, wherein the input stage of the charge integrator comprises a pair of symmetrically connected complementary JFET transistors, the gates of which are connected to the input of the charge integrator, wherein an n-type transistor of the complementary pair of transistors has a drain connected to a voltage regulating system, wherein the voltage regulating system is configured to set the gate current of the p-type transistor as being equal to the gate current of the n-type transistor.

Preferably, the system further comprises a key for short-circuiting the capacitance of the feedback and a regulated power source connected to the drain of the p-type transistor, wherein the regulated power source is set so as to set a zero output voltage of the system for measuring an electrical charge when the key is closed.

BRIEF DESCRIPTION OF FIGURES

The present invention is shown by means of exemplary embodiments on a drawing, in which.

DETAILED DESCRIPTION OF EMBODIMENTS

Figure 4:
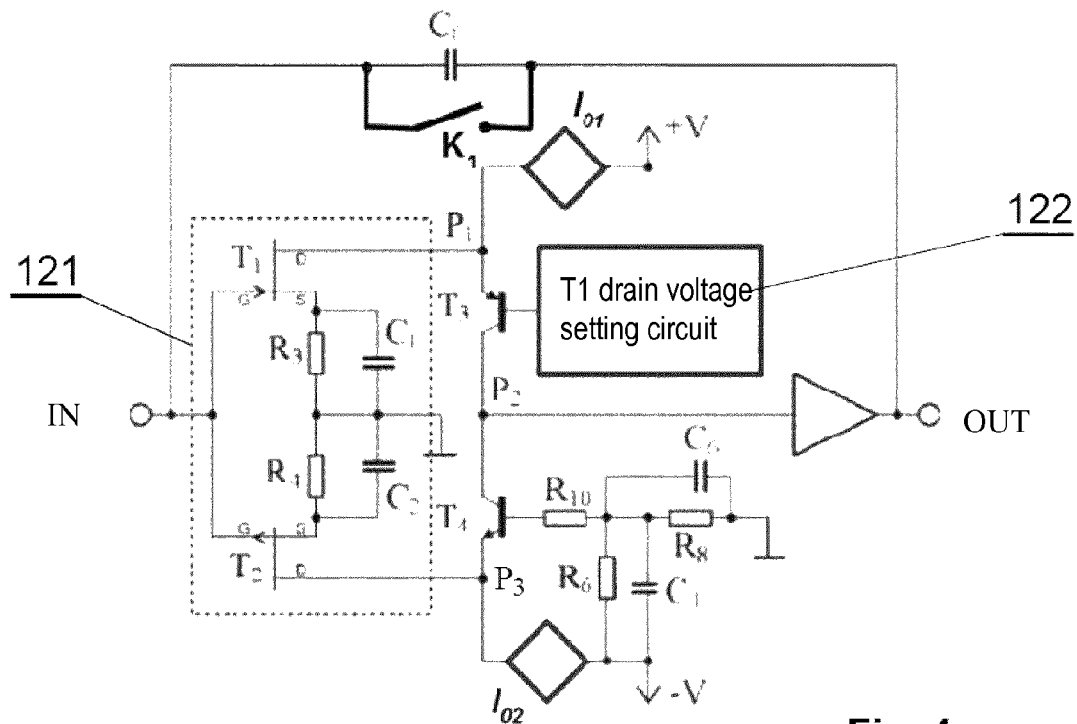
FIG. 4 shows an exemplary embodiment of the charge integrator according to the invention.

FIG. 4 shows an exemplary embodiment of the charge integrator to be used as an element of the system for measuring electrical charge according to the present invention. The input stage 121 of the charge integrator 120 comprises a pair of symmetrically connected JFET transistors $T_1$, $T_2$, whose gates are connected to the input of the charge integrator. The structure of the input of the system, which is symmetrical due to the type of transistors used (pnp, npn), forces the symmetrical operation of the system and of the supply voltages, which define the operating point of the system. The transistor $T_1$, together with the transistor $T_3$ are powered from the current source $I_{01}$, which is independent of the potential at point $P_1$. The value of voltage at point $P_1$ is a result of supplying the base of the transistor $T_3$ by constant voltages (the emitter voltage is higher than this voltage approximately by a constant value of the base-emitter junction voltage) and can be changed in this way (i.e. selected so as to properly influence the gate current of the transistor $T_1$, as will be discussed further in the description).

Figure 6:
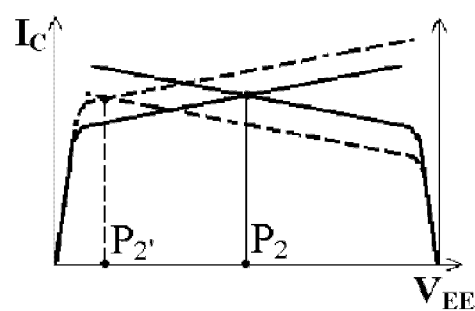
FIG. 6 shows a change in the potential of point $P_2$ in the charge integrator.

Suppose that in case of a charge impulse, the current flowing through the transistor $T_1$ decreases (and at the same time the current flowing through the transistor $T_2$ increases). Because transistors $T_1$ and $T_3$ are powered by a common power source $I_{01}$, a drop in the current flowing through the transistor $T_1$ causes an identical (in amplitude) increase in the current flowing through the transistor $T_3$. The transistor $T_3$ may be treated as forming a common base amplifier. The transistor $T_4$ constitutes both a load for the transistor $T_3$, as well as it by itself constitutes symmetrically a part of the common-base amplifier OB, for which transistor $T_3$ constitutes an active load. The principle of generation of the output impulse in the system is shown in FIG. 6, which shows a change in the potential of point P2 as a result of the intersection of the collector characteristics of transistors $T_3$ and $T_4$, wherein $V_{EE}$ is the voltage between the emitters of transistors $T_3$ and $T_4$.

Figure 5:
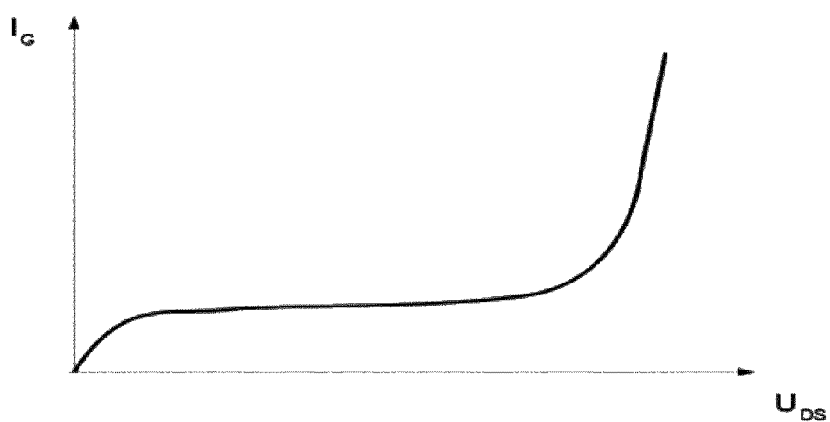
FIG. 5 shows an avalanche effect.

The source $I_{01}$ constitutes a source generating a constant current, independent of the potential on the drain of transistor $T_1$. This allows for changing the potential of the base of transistor $T_3$ without changing the current flowing through this transistor. Transistor $T_1$ can also be treated as a constant current source. Such configuration allows for operating with different voltages on the $T_1$ transistor drain. In turn, the change of the potential in the drain of transistor $T_1$ allows for controlling the gate current of transistor $T_1$ as a result of the avalanche effect, which is shown in FIG. 5, showing a graph of the dependence of the gate current of the JFET transistor on the source-drain voltage.

The input of the charge integrator is therefore constituted by two junctions of the JFET transistors. It can be thus assumed that they constitute two diodes connected in an anti-parallel manner, implementing a system protecting from the occurrence of excessive voltage impulse.

Figure 1:
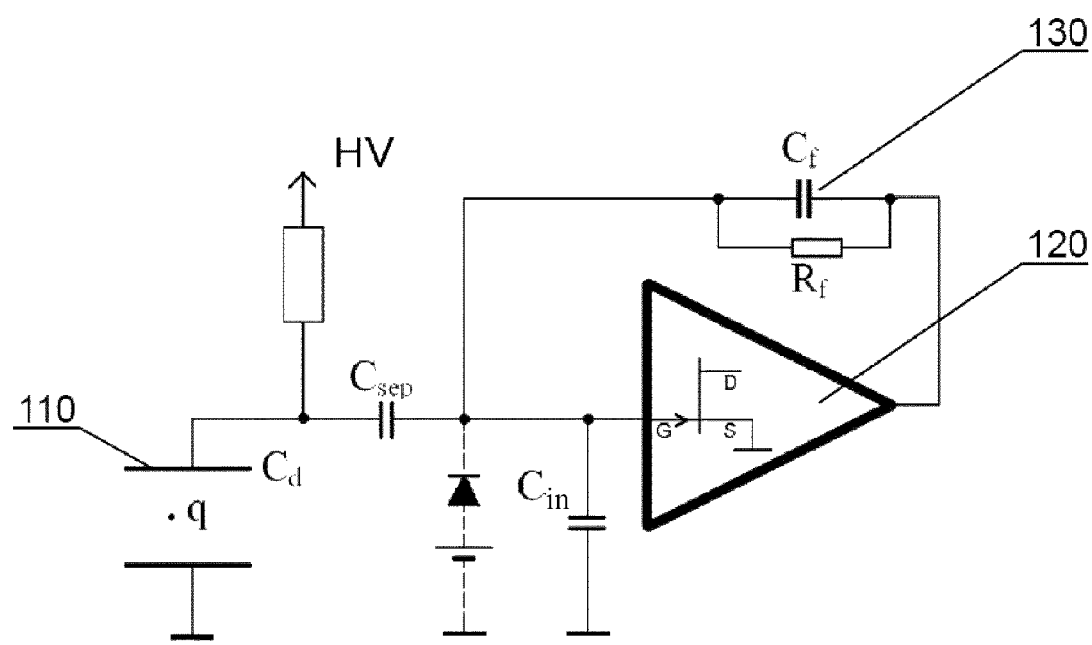
FIG. 1 shows a known system for measuring an electrical charge using a charge integrator.
Figure 2:
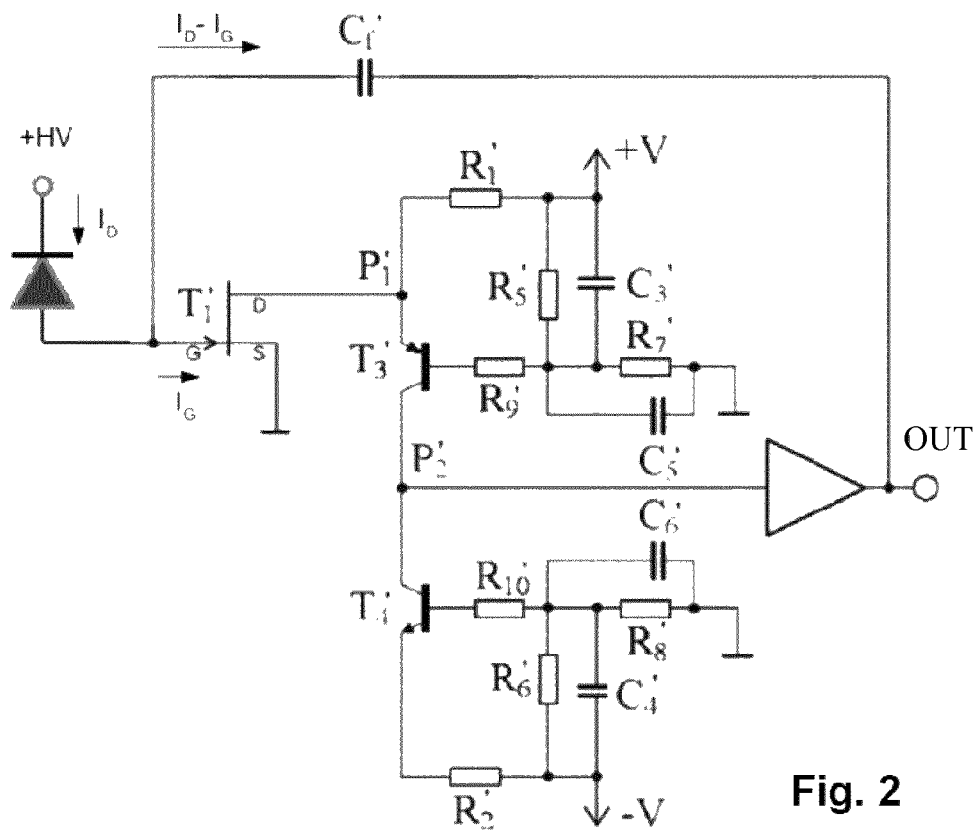
FIG. 2 shows a semiconductor detector known in the art.
Figure 3:
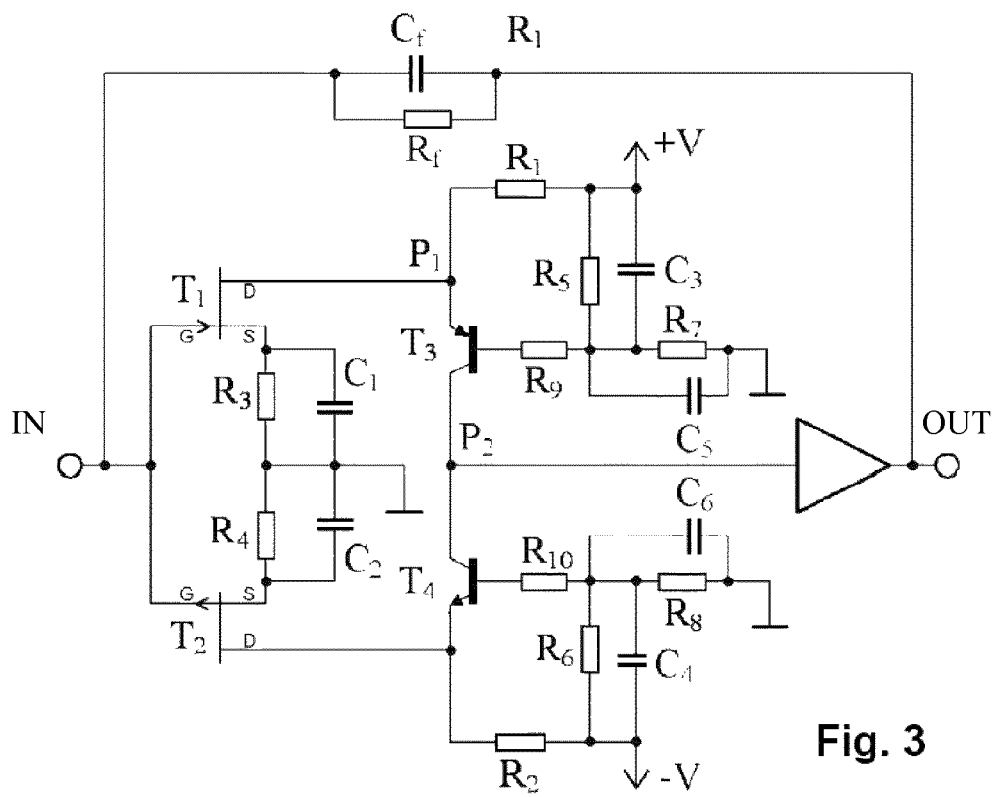
FIG. 3 shows a charge integrator known in the art.

Even though the system shown in FIGS. 3 and 4 has symmetry due to the type of the semiconductors used, some differences can appear, especially for the JFET transistors. In these transistors the gate current depends on the voltage on the drain (see. E.g. Paul Horowitz, Winfield Hill "The art of electronics"). Increasing this voltage, above a certain level, causes significant increase of the gate current as a result of the occurrence of the avalanche effect (FIG. 5). This effect will be much stronger for n-channel transistors. Because of this, in the system according to the invention, this type of transistor (transistor $T_1$) is treated as an element with regulated (adjustable) gate current. In the system according to the invention, the type of the p-channel transistor $T_2$ is selected and the voltage on its drain is set using a voltage divider formed by resistors $R_6$, $R_8$, so that this selection and this setting would allow the current of its gate to be balanced by the current gate selected in transistor $T_1$ using the system 122 giving the voltage on its drain. As the effect of balancing of these currents, high input resistance of the system is achieved, as well as virtually lack of the charging current of the capacitance $C_f$ from the side of the gate currents of JFET transistors.

For example, an n-channel transistor $T_1$ is selected so as that its gate current is slightly smaller than the gate current of the p-channel transistor $T_2$ for certain quiescent voltage. This gives a possibility to equalize the gate currents as a result of increasing the gate current of transistor $T_1$. Such regulation is possible by regulating the voltage on the drain of the transistor $T_1$ and causing in this way the avalanche effect on the junction of its gate.

The system 122 setting the voltage can be in form of a manually controlled potentiometer. The potentiometer is set to a value that will cause the output voltage (observed e.g. using a meter) to remain unchanged in a predetermined time.

Alternatively, the system 122 setting the voltage can be an automatic system, adapted to regulate the voltage of the drain of transistor $T_1$ so that the constant component of the output voltage does not change.

The system comprises also a regulated power source $I_{02}$. The current of this source is selected so that during closing of a key K1 connected in parallel to the capacitance $C_r$ of the feedback, formed for example on the basis of miniature reed switch, the output voltage equal to zero is achieved. After selecting and storing this current in a suitable electronic circuit and opening this key K1, the system is ready to measure the induced charge.

Figure 7:
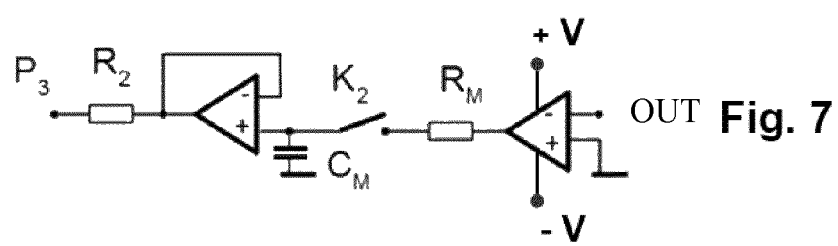
FIG. 7 shows a regulated current source.

FIG. 7 shows an exemplary embodiment of the regulated power source $I_{02}$. This source is constituted by a resistor R2 connected between the point P3 (constant potential) and the output of the operational amplifier. In this example, the amplifier with a high input resistance has been used. On the input of this amplifier, which functions as a voltage follower, there is a capacitance of several microfarads. After opening a key K2 (which can be a reed switch), the follower remembers (for even a couple of hours) the voltage on the capacitor $C_M$ and the constant flow of the current to point $P_3$ is provided. The voltage on the capacitor $C_M$ is set with time constant of order of milliseconds (closed key $K_2$) by the feedback circuit, implemented on the following operational amplifier. In this system, in the feedback loop (for closed keys $K_1$, $K_2$), the zero value of the output voltage is enforced by setting appropriate voltage on the capacitor $C_M$. After this operation (lasting a couple of milliseconds), the system is ready for measurement, during which keys $K_1$ and $K_2$ are opened. The value of the accumulated charge is then measured as the voltage on the capacitor $C_f$ (the output of the integrator).

Due to the compensation of quiescent currents of the integrator, the input resistance of the system tends towards infinity, and consequentially the system according to the invention can be used for measuring a very slowly induced charge.

Due to the fact that the input of the system is protected from breakdowns and occurrence of relatively big charge signals, the system can be used widely in scientific, medical and also industrial research.

The system according to the invention can be used in standard situations, as well as in situations in which the charge is accumulated relatively slowly, for example in the process of its induction lasting even for a couple of seconds or a couple of tens of seconds. In the systems known in the prior art, especially in the system disclosed in WO2012114291, a feedback compensating gate currents of FET transistors is not used. In case of using resistance feedback—taking into account time constants for 1 pF capacitance of the feedback, and the resistance of the feedback of $10^9$—a maximal time constant of the capacitor discharge of $10^{-3}$ second is achieved. In the solution according to the present invention, due to appropriate currents compensation, the time constant of the capacitor's discharge is much higher, easily reaching said value of a few tens to a few hundreds of seconds.

The invention claimed is:

1. A system for measuring electrical charge, the system comprising:
    a charge integrator comprising an operational amplifier and a feedback capacitance connected between an input and output of the operational amplifier,
    a capacitance detector connected to an input of the charge integrator, wherein an input stage of the charge integrator comprises a pair of symmetrically connected complementary JFET transistors, wherein gates of each transistor of the pair of the symmetrically connected complementary JFET transistors are connected to the input of the charge integrator,
    and a voltage controlling system connected to a drain of an n-type transistor of the pair of the symmetrically connected complementary JFET transistors for equalizing a gate current of a p-type transistor of the pair of the symmetrically connected complementary JFET transistors with a gate current of the n-type transistor of the pair of the symmetrically connected complementary JFET transistors,
    wherein the voltage controlling system is a system adapted to automatically set a drain voltage of the n-type transistor of the pair of the symmetrically connected complementary JFET transistors to a value for which a DC component of an output voltage of the charge integrator does not change.

2. The system according to claim 1, wherein the voltage controlling system is a manually-controlled potentiometer.

3. The system according to claim 1, wherein for a particular quiescent voltage, the gate current of the n-type transistor is lower than the gate current of the p-type transistor.

4. The system according to claim 1, wherein the drain of the n-type transistor is powered by a power source whose current is independent of a voltage potential of the drain of the n-type transistor.

5. The system according to claim 1, further comprising a regulated power source connected to a drain of the p-type transistor.

6. A method for measuring an electrical charge by means of a system comprising:
    a charge integrator comprising an operational amplifier and a feedback capacitance connected between an input and output of the operational amplifier,
    a switch for short-circuiting the feedback capacitance,
    a capacitance detector connected to an input of the charge integrator, wherein an input stage of the charge integrator comprises a pair of symmetrically connected complementary JFET transistors, wherein gates of each transistor of the pair of the symmetrically connected complementary JFET transistors are connected to the input of the charge integrator,
    and a voltage controlling system connected to a drain of an n-type transistor of the pair of the symmetrically connected complementary JFET transistors,
    a regulated power source connected to a drain of the p-type transistor of the pair of the symmetrically connected complementary JFET transistors,
    the method comprising equalizing, by means of the voltage controlling system, a gate current of the p-type transistor of the pair of the symmetrically connected complementary JFET transistors with a gate current of the n-type transistor of the pair of the symmetrically connected complementary JFET transistors and setting the regulated power source so as to set a zero output voltage of the charge integrator when the switch is closed.

* * * * *